(12) United States Patent
Kawahara

(10) Patent No.: US 12,191,830 B2
(45) Date of Patent: Jan. 7, 2025

(54) SWITCHED-CAPACITOR AMPLIFIER

(71) Applicant: DENSO CORPORATION, Kariya (JP)

(72) Inventor: Shogo Kawahara, Kariya (JP)

(73) Assignee: DENSO CORPORATION, Kariya (JP)

( * ) Notice: Subject to any disclaimer, the term of this patent is extended or adjusted under 35 U.S.C. 154(b) by 651 days.

(21) Appl. No.: 17/458,892

(22) Filed: Aug. 27, 2021

(65) Prior Publication Data

US 2021/0391838 A1 Dec. 16, 2021

Related U.S. Application Data

(63) Continuation of application No. PCT/JP2020/006059, filed on Feb. 17, 2020.

(30) Foreign Application Priority Data

Mar. 14, 2019 (JP) .................. 2019-047112

(51) Int. Cl.
*H03F 3/45* (2006.01)

(52) U.S. Cl.
CPC ............... *H03F 3/45475* (2013.01); *H03F 2203/45116* (2013.01)

(58) Field of Classification Search
CPC ....... H03F 3/45475; H03F 2203/45116; H03F 2203/45514; H03F 3/70; H03M 1/765
USPC ...................................... 330/252, 9
See application file for complete search history.

(56) References Cited

U.S. PATENT DOCUMENTS 6,567,024 B1  5/2003  Ishikawa
6,850,098 B2  2/2005  Lee et al.

FOREIGN PATENT DOCUMENTS

JP  2010-055684 A  3/2010
JP  5309616 B2  10/2013
JP  2018-088637 A  6/2018

*Primary Examiner* — Andrea Lindgren Baltzell
*Assistant Examiner* — Khiem D Nguyen
(74) *Attorney, Agent, or Firm* — Posz Law Group, PLC

(57) ABSTRACT

A switched-capacitor amplifier includes a sampling capacitor, a first switch, a differential amplifier, a reference power supply, a second switch, a third switch, and a controller configured to execute on and off control of the first to third switches. The second switch includes a series circuit of first and second metal oxide semiconductor (MOS) transistors and a potential holding capacitor connected between a node that is a common connection point of the first and second MOS transistors and a ground.

4 Claims, 15 Drawing Sheets

SWITCHED-CAPACITOR AMPLIFIER

CROSS REFERENCE TO RELATED APPLICATIONS

The present application is a continuation application of International Patent Application No. PCT/JP2020/006059 filed on Feb. 17, 2020, which designated the U.S. and claims the benefit of priority from Japanese Patent Application No. 2019-047112 filed on Mar. 14, 2019. The entire disclosures of all of the above applications are incorporated herein by reference.

TECHNICAL FIELD

The present disclosure relates to a switched-capacitor amplifier.

BACKGROUND

There has been known a switched capacitor amplifier configured to accumulate a charge in a sampling capacitor at the time of sampling, and to output a voltage based on the charges accumulated in the sampling capacitor at the time of holding.

SUMMARY

The present disclosure provides a switched-capacitor amplifier including a sampling capacitor, a first switch, a differential amplifier, a reference power supply, a second switch, a third switch, and a controller configured to execute on and off control of the first to third switches. The second switch includes a series circuit of first and second metal oxide semiconductor (MOS) transistors and a potential holding capacitor connected between a node that is a common connection point of the first and second MOS transistors and a ground.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
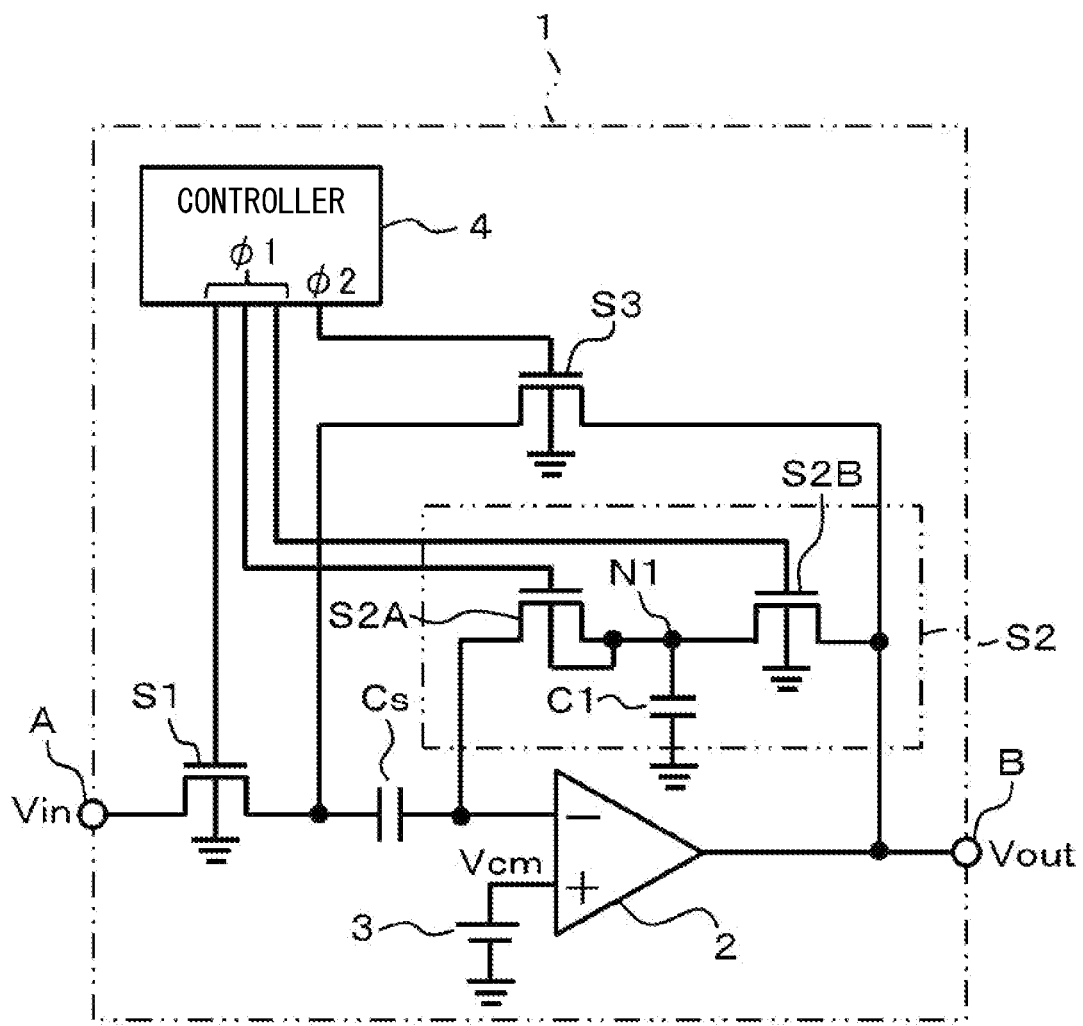
FIG. 1 is an electrical configuration diagram illustrating a switched-capacitor amplifier according to a first embodiment.

In a switched-capacitor amplifier, at the time of sampling, an input terminal is connected to one terminal of the capacitor via a first switch, and the other terminal of the capacitor connected to the input terminal of the amplifier is connected to the output terminal of the amplifier by turning on a second switch. As a result, the charge is accumulated in the capacitor by the voltage input from the input terminal.

On the other hand, at the time of holding, the first switch and the second switch are turned off, and a third switch that connects the one terminal of the capacitor and the output terminal of the amplifier is turned on. As a result, an input voltage is output at the output terminal of the amplifier.

The first to third switches described above are generally configured with MOS transistors, and in a case where both terminals of the capacitor are not disconnected completely when the switches are turned off, the charge of the capacitor may leak. For this reason, when the hold period increases, the terminal voltage of the capacitor may change largely, and the accuracy of the output voltage of the amplifier may decrease.

A switched-capacitor amplifier according to one aspect of the present disclosure includes a sampling capacitor, a first switch connected between a signal input terminal and one terminal of the sampling capacitor, a differential amplifier including an inverting input terminal connected to another terminal of the sampling capacitor and an output terminal connected to a signal output terminal, a reference power supply configured to apply a predetermined voltage to a non-inverting input terminal of the differential amplifier, a second switch connected between the inverting input terminal of the differential amplifier and the signal output terminal, a third switch connected between a common connection point of the first switch and the sampling capacitor and the signal output terminal, a controller configured to execute on and off control of the first to third switches. The second switch includes a series circuit of first and second MOS transistors and a potential holding capacitor connected between a node that is a common connection point of the first and second MOS transistors and a ground, and a back gate of the first MOS transistor is connected to the node.

According to the above configuration, first, in a state where an input voltage is input from the signal input terminal, the first switch and the two second switches are turned on by the controller at the time of sampling. As a result, the charge is accumulated in the sampling capacitor through the first switch by the input voltage. At this time, the charge is also accumulated in the potential holding capacitor from the first MOS transistor included in the second switch, and the terminal voltage of the potential holding capacitor is equal to the voltage of the sampling capacitor and the voltage of the inverting input terminal of the differential amplifier. In addition, since the inverting input terminal of the differential amplifier has the predetermined voltage of the reference power supply connected to the non-inverting input terminal, the terminal voltage of the potential holding capacitor is also the predetermined voltage of the reference power supply.

Thereafter, when the first switch and the second switch are turned off and the third switch is turned on, a voltage based on the charge accumulated in the sampling capacitor is output to the signal output terminal. At this time, in the first MOS transistor constituting the second switch, both the source and the drain are held at the predetermined voltage of the reference power supply, so that occurrence of sub-threshold leakage can be restricted. Furthermore, in the first MOS transistor, since the back gate is also held at the predetermined voltage of the reference power supply in addition to the source and the drain, the occurrence of junction leakage can also be restricted.

Therefore, the charge in the sampling capacitor does not leak through the second switch, so that the output voltage can be accurately output.

First Embodiment

Hereinafter, a first embodiment of the present disclosure will be described with reference to FIGS. 1 to 4. A switched-capacitor amplifier (hereinafter, abbreviated as "SC amplifier") 1 is formed on, for example, a silicon on insulator (SOI) substrate or the like, and has a configuration in which elements such as transistors formed therein can be provided in an electrically insulated state. The SC amplifier 1 takes in an input voltage Vin applied to an input terminal A in a period of sampling φ1 and outputs an output voltage Vout at an output terminal B in a period of holding φ2.

The SC amplifier 1 includes a differential amplifier 2, a reference power supply 3, a controller 4, a sampling capacitor Cs, and switches S1, S2, and S3 corresponding to first to third switches. The switches S1 and S3 are n-channel MOS transistors. The switch S2 includes switches S2A and S2B respectively including n-channel first and second MOS transistors, and a capacitor C1 as a potential holding capacitor.

The input terminal A of the SC amplifier 1 is connected to one terminal of the sampling capacitor Cs via the switch S1. The substrate potential, that is, the back gate of the switch S1 is connected to the ground. The other terminal of the sampling capacitor Cs is connected to an inverting input terminal of the differential amplifier 2. The non-inverting input terminal of the differential amplifier 2 is connected so as to receive a reference voltage Vcm from the reference power supply 3. The output terminal of the differential amplifier 2 is connected to the output terminal B.

The series circuit of the switches S2A and S2B is connected between the inverting input terminal and the output terminal of the differential amplifier 2. The capacitor C1 is connected between a node N1, which is a common connection point of the switches S2A and S2B, and the ground. The back gate of the switch S2A is connected to the node N1 together with the source. The back gate of the switch S2B is connected to the ground. The switch S3 is connected between a common connection point of the switch S1 and the sampling capacitor Cs and the output terminal B.

The controller 4 applies a drive signal to the gates of the switches S1, S2A, S2B, and S3 to execute on and off control. The controller 4 executes drive control of the switches S1, S2A, S2B, and S3 in the respective periods of sampling φ1 and holding φ2 according to sampling and hold signals provided from the outside.

Figure 2:
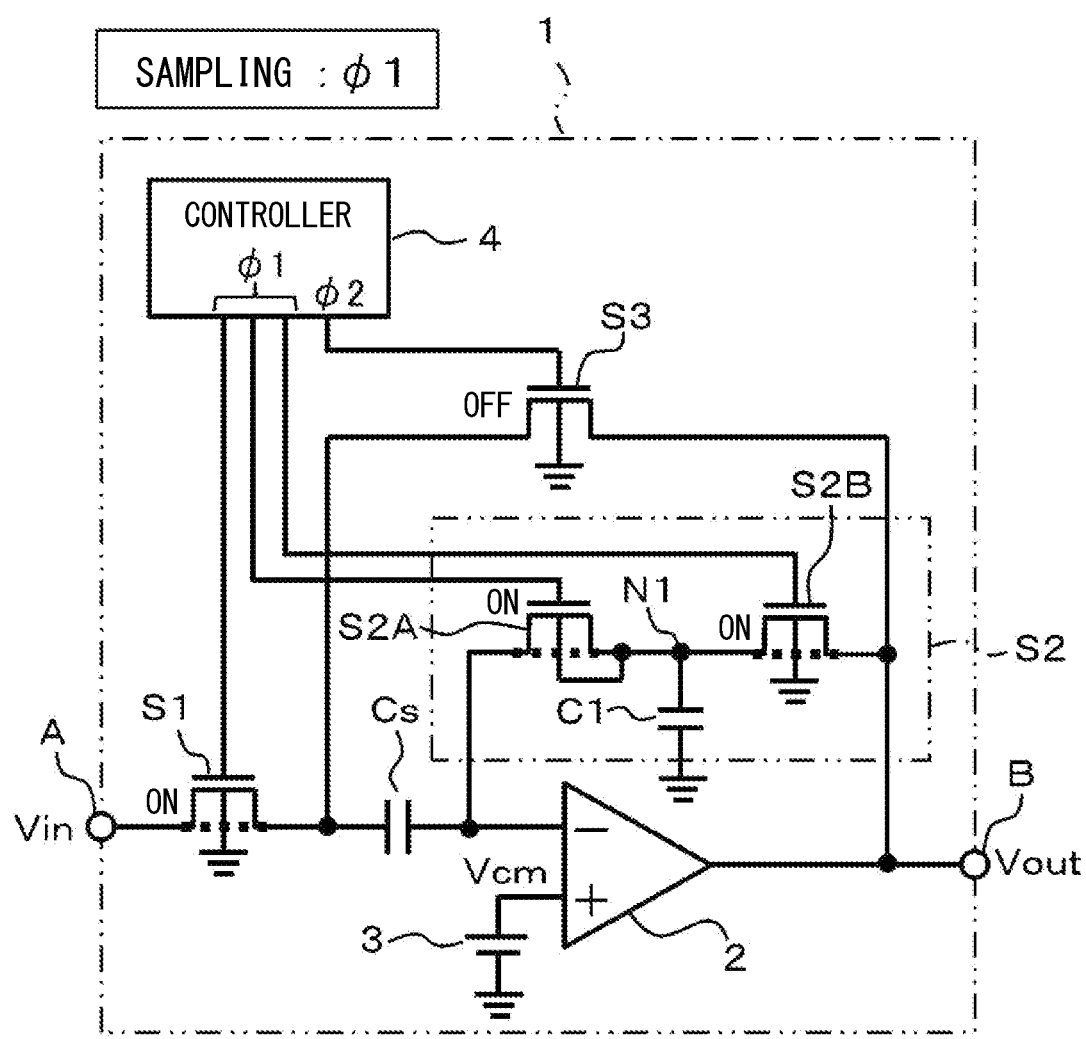
FIG. 2 is a first operation explanatory diagram according to the first embodiment.

Next, the operation of the above configuration will be described with reference to FIGS. 2 to 4. First, as illustrated in FIG. 2, in the period of sampling φ1, the input voltage Vin applied to the input terminal A is taken into the sampling capacitor Cs. In the sampling φ1, the controller 4 executes drive control to turn on the switches S1, S2A, and S2B and turn off the switch S3. In FIG. 2, the source and the drain of each of the switches S1, S2A, and S2B are connected by a thick dotted line to indicate an on state.

As a result, the input voltage Vin is applied to the sampling capacitor Cs. At this time, the circuit path between the output terminal and the inverting input terminal of the differential amplifier 2 is conductive and has the same potential as the output terminal B. In addition, since the reference voltage Vcm is applied to the non-inverting input terminal of the differential amplifier 2, the inverting input terminal also has the reference voltage Vcm.

As a result, the input voltage Vin and the reference voltage Vcm are applied between both terminals of the sampling capacitor Cs, and the charge corresponding to a difference voltage Vin-Vcm is accumulated in the sampling capacitor Cs. In addition, at this time, the charge corresponding to the reference voltage Vcm is accumulated in the capacitor C1 connected to the node N1 of the switches S2A and S2B.

Figure 3:
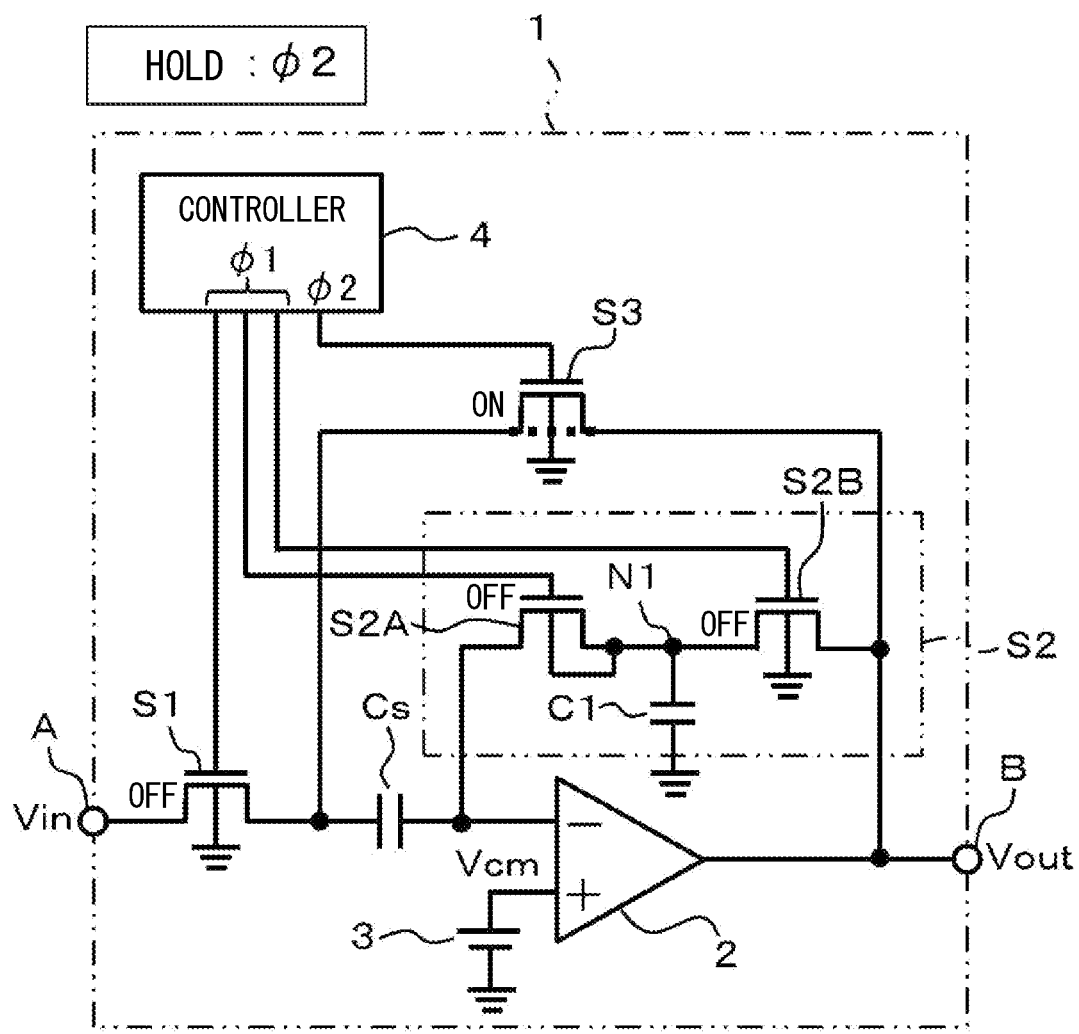
FIG. 3 is a second operation explanatory diagram according to the first embodiment.

Next, as illustrated in FIG. 3, in the period of holding φ2, the difference voltage Vin-Vcm due to the charge taken in the sampling capacitor Cs is output to the output terminal Vout. In the holding φ2, the controller 4 executes drive control to turn off the switches S1, S2A, and S2B and turn on the switch S3. In FIG. 3, the source and the drain of the switch S3 are connected by a thick dotted line to indicate the on state.

As a result, a voltage corresponding to the input voltage Vin is output at the output terminal B as the output voltage Vout by the charge accumulated in the sampling capacitor Cs. At this time, the inverting input terminal of the differential amplifier 2 has the same potential as the voltage Vcm of the non-inverting input terminal. In addition, the inverting input terminal of the differential amplifier 2 is connected to the drain of the switch S2A in an off state.

Here, in the switch S2A in the off state, the potential of the drain is Vcm, and the potential of the source is also held at Vcm by the charge accumulated in the capacitor C1. Further, since the back gate of the switch S2A is connected to the source, the potential is held at Vcm. As a result, in the switch S2A, the drain, the source, and the back gate all have the same potential Vcm, and the off state where no leakage occurs is maintained.

In the period of holding φ2 described above, since the switch S2 is provided as a single MOS transistor in the conventional configuration without the switches S2A and S2B, and the capacitor C1, a leakage current to be described below is generated.

That is, in the case of the switch S2 including a single MOS transistor, the potential of the drain is Vcm, the potential of the source is Vout, and the back gate is at the ground level in a state where the switch S2 is in the off state during the period of holding φ2. Consequently, in the switch S2, a potential difference is generated between the drain connected to the side of the differential amplifier 2 and the back gate, and junction leakage occurs. In addition, a potential difference is also generated between the source and the drain connected to the side of the differential amplifier 2, and sub-threshold leakage occurs.

The leakage current Ileak increases with a duration Th of the period of holding φ2 to generate a potential difference ΔV. Even if the potential difference ΔV is small in a single configuration, the potential difference ΔV cumulatively increases with the length of the period of holding φ2 or by repeating processing a plurality of times, resulting in a decrease in accuracy. Specifically, the potential difference ΔV can be calculated by the following equation (1).

$$\Delta V = (Ileak \times Th)/Cs \quad (1)$$

Next, the above operation will be described with reference to timing diagrams illustrated in FIG. 4A to FIG. 4D using specific numerical values of the voltages of the respective components. Here, a description will be given in a case where the input voltage Vin is set to 0.7 V and the reference voltage Vcm is set to 0.6 V.

Figure 4A:
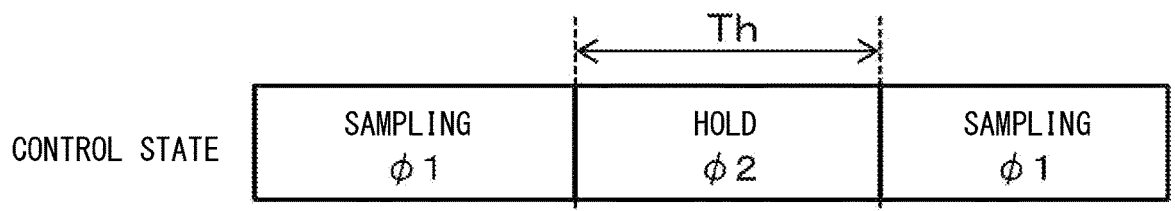
FIG. 4A is a timing diagram illustrating a control state according to the first embodiment.
Figure 4B:
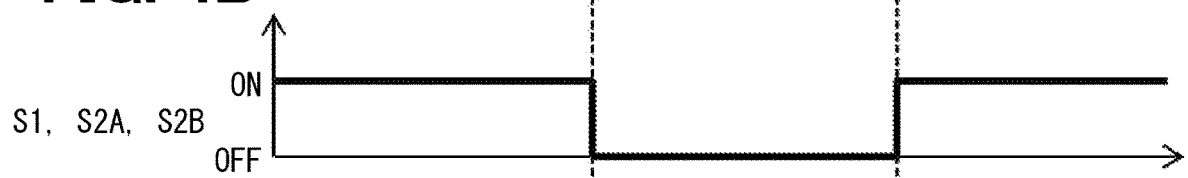
FIG. 4B is a timing diagram illustrating an on-off state of each of a first switch, a first MOS transistor, and a second MOS transistor according to the first embodiment.
Figure 4C:
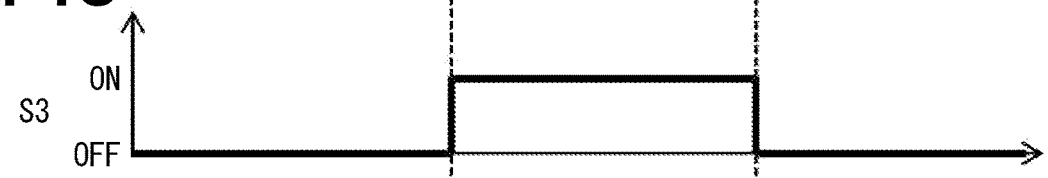
FIG. 4C is a timing diagram illustrating an on-off state of a third switch according to the first embodiment.

First, in the period of sampling φ1 illustrated in FIG. 4A, as illustrated in FIGS. 4B and 4C, the switches S1, S2A, and S2B are controlled to be in the on state, and the switch S3 is controlled to be in the off state. In this state, the sampling capacitor Cs is charged by the input voltage Vin, and the output voltage Vout is held at Vcm as illustrated in FIG. 4D.

Thereafter, when the period of holding φ2 starts at time t1, as illustrated in FIG. 3, the switches S1, S2A, and S2B are controlled to be turned off, and the switch S3 is controlled to be turned on. In this state, the charge accumulated by charging the sampling capacitor Cs is held, and the input voltage Vin, which is the terminal voltage of the sampling capacitor Cs, is the output voltage Vout, so that the output voltage Vout is 0.6 V as illustrated in FIG. 4D.

Figure 4D:
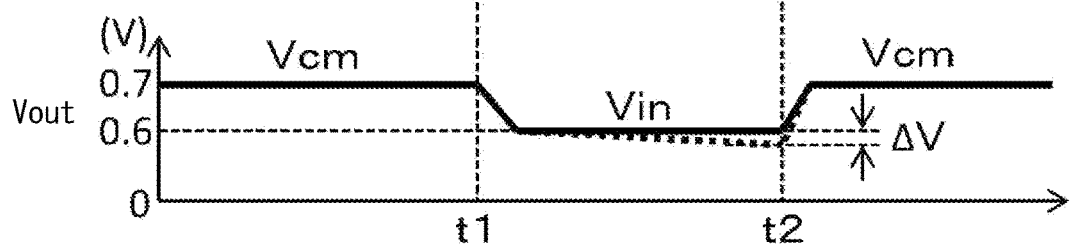
FIG. 4D is a timing diagram illustrating an output voltage according to the first embodiment.

At this time, since junction leakage does not occur in the switch S2A as described above in the present embodiment, it is possible to hold the output voltage Vout of 0.6 V without changing during the duration Th of the period of holding φ2 as indicated by a solid line in FIG. 4D.

In FIG. 4D, for comparison, a waveform during the period of holding φ2 in the conventional configuration in which the leakage current Ileak occurs is indicated by a broken line. In this case, since the potential difference ΔV represented by the above equation (1) is generated, for example, a voltage in units of mV is generated as an error at time t2 when the duration Th of the period of holding φ2 has elapsed. Even if the potential difference ΔV has a small value in a sample-and-hold operation for one stage, the error may be cumulatively increased by repeating the operation a plurality of times.

Thereafter, at the time t2 when the period of holding φ2 has elapsed, the period of sampling φ1 starts again, and as illustrated in FIGS. 2, 4B, and 4C, the controller 4 drives the switches S1, S2A, and S2B to be on, and drives the switch S3 to be off. As a result, in the sampling capacitor Cs, the input voltage Vin is applied to one terminal via the switch S1, and the voltage Vcm of the inverting input terminal of the differential amplifier 2 is applied to the other terminal.

Consequently, the sampling capacitor Cs is charged by the input voltage Vin, and the potential increases, and as the switches S2A and S2B are turned on, the output voltage Vout of the output terminal B increases to Vcm and 0.7 V is output as illustrated in FIG. 4D.

As described above, in the first embodiment, two switches S2A and S2B are connected in series as the switch S2, the capacitor C1 is connected to the node N1, and the back gate of the switch S2A is connected to the node N1.

Consequently, when the switch S2A is turned off, the source-drain and the back gate can all be set to the same potential, which is the reference potential Vcm, and junction leakage and sub-threshold leakage can be restricted. As a result, it is possible to restrict the charge leakage of the sampling capacitor Cs with a simple configuration, thereby eliminating an error that is generated as the time elapses in the period of holding φ2.

In addition, in the present embodiment, by adopting a trench isolation configuration using an SOI substrate, the parasitic bipolar transistor structure is eliminated between adjacent elements, and thus, even in a case where the back gate potential of a MOS transistor fluctuates, the malfunction caused by the parasitic bipolar transistor can be avoided. As a result, it is not necessary to increase the distance between adjacent MOS transistors in order to avoid the malfunction, and space saving can be achieved.

The SC amplifier 1 adapted to a single-ended amplifier has been described in the above embodiment, but the present disclosure is not limited thereto, and the present disclosure can also be applied to a SC amplifier with a differential configuration.

Second Embodiment

FIG. 5A to FIG. 5F are timing diagrams according to a second embodiment, and hereinafter, portions different from those of the first embodiment will be described. The present embodiment has the same configuration as the first embodiment, but is different from the first embodiment in the control content of the controller 4. That is, the controller 4 is configured to execute on and off control of all the switches S1, S2A, S2B and the switch S3 at a different timing.

In the present embodiment, the switches S1, S2A, and S2B and the switch S3 are switched as follows.

Figure 5A:
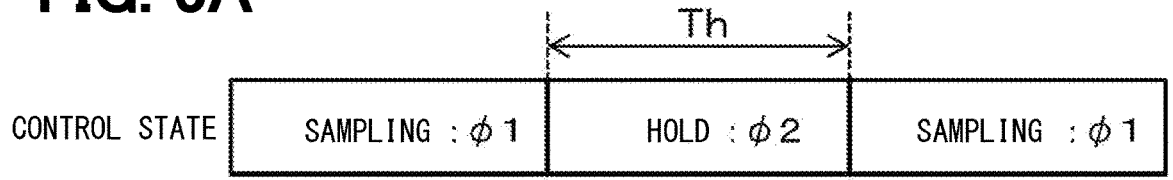
FIG. 5A is a timing diagram illustrating a control state according to a second embodiment.
Figure 5B:
FIG. 5B is a timing diagram illustrating an on-off state of a first switch according to the second embodiment.

(1) Control at the time of transition from the period of sampling φ1 to the period of holding φ2
   (a) Turn off switch S2A at time t1a→(b) Turn off switch S2B at time t1b→(c) Turn off switch S1 at time t1c→(d) Turn on switch S3 at time t1d (2) Control at the time of transition from the period of holding φ2 to the period of sampling φ1
   (a) Turn off switch S3 at time t2a→(b) Turn on switch S2B at time t2b→(c) Turn on Switch S2A at time t2c→(d) Turn on switch S1 at time t2d Hereinafter, the above operation will be described in detail. As illustrated in FIG. 5A, during the period of sampling φ1, the controller 4 controls the switches S1, S2A, and S2B to be in the on state and the switch S3 to be in the off state in the same manner as described above. In this state, the sampling capacitor Cs is charged by the input voltage Vin, and the output voltage Vout is held at Vcm, that is, 0.7 V as illustrated in FIG. 5F.

(1) Control at the time of transition from the period of sampling φ1 to the period of holding φ2

Figure 5C:
FIG. 5C is a timing diagram illustrating an on-off state of a first MOS transistor according to the second embodiment.

Thereafter, at the time t1a corresponding to the time t1, as illustrated in FIG. 5C, the controller 4 first turns off the switch S2A in the on state to disconnect the path through which the charge of the sampling capacitor Cs flows. At this time, the capacitor C1 is charged to a voltage at which the potential of the node N1 is Vcm. In this state, since the voltage across the source and the drain of the switch S2A is Vcm and the voltage of the back gate is also Vcm, the switch S2A does not generate a leakage current.

Figure 5D:
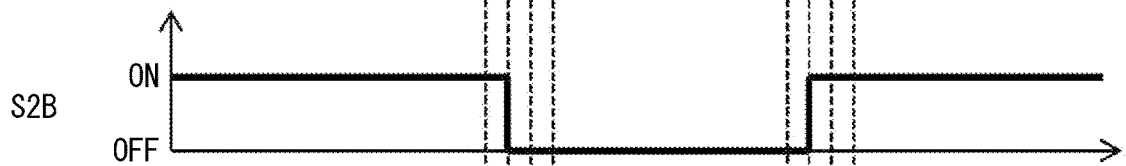
FIG. 5D is a timing diagram illustrating an on-off state of a second MOS transistor according to the second embodiment.

At the time t1b slightly delayed from the time t1a, the switch S2B in the on state is turned off by the controller 4 as illustrated in FIG. 5D. As a result, in the capacitor C1, the node N1 is disconnected from the output terminal B, and the charge is held. By turning off the switches S2A and S2B at a different timing as described above, it is possible to expect an effect of reducing a channel charge injection error and ripple noise at the time of switching.

Subsequently, at the time t1c slightly delayed from the time t1b, the switch S1 in the on state is turned off by the controller 4 as illustrated in FIG. 5B. As a result, the sampling capacitor Cs is disconnected from the input terminal A. In this state, the charge charged by the input voltage Vin is held in the sampling capacitor Cs.

Figure 5E:
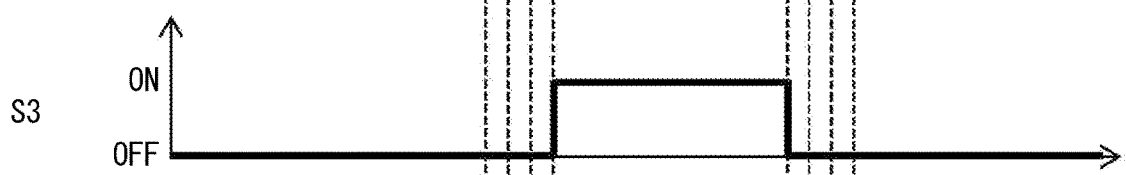
FIG. 5E is a timing diagram illustrating an on-off state of a third switch according to the second embodiment.
Figure 5F:
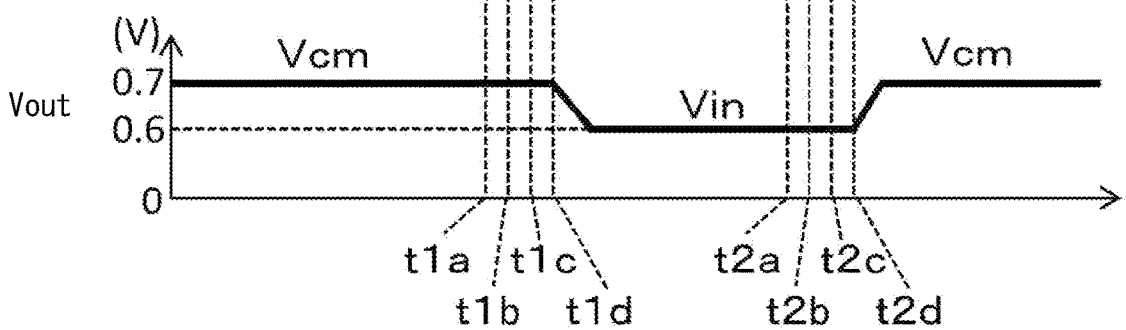
FIG. 5F is a timing diagram illustrating an output voltage according to the second embodiment.

Subsequently, at the time t1d slightly delayed from the time t1c, the switch S3 in the off state is turned on by the controller 4 as illustrated in FIG. 5E. As a result, as illustrated in FIG. 5F, the voltage Vin generated by the charge accumulated in the sampling capacitor Cs can be output at the output terminal B as the output voltage Vout.

Moreover, in this state, since the switch S2A is in the off state and the source, drain, and back gate of the switch S2A are all have the voltage Vcm as in the first embodiment, no junction leakage occurs, and the charge of the sampling capacitor Cs can be prevented from being discharged from the switch S2A.

Consequently, the state where the output voltage Vout is the input voltage Vin is maintained regardless of the length of the period of holding φ2. In this state, the charge accumulated in the sampling capacitor Cs is held, and the input voltage Vin, which is the terminal voltage of the sampling capacitor Cs, is the output voltage Vout, so that the output voltage Vout is 0.6 V.

(2) Control at the time of the transition from the period of holding φ2 to the period of sampling φ1

Thereafter, at the time t2a corresponding to the time t2 when the period of holding φ2 has elapsed, as illustrated in FIG. 5E, the controller 4 first turns off the switch S3 in the on state. As a result, the one terminal side of the sampling capacitor Cs is disconnected from the output terminal B, but as illustrated in FIG. 5F, the output voltage Vout is held at 0.6 V, which is the voltage of the input voltage Vin.

At the time t2b slightly delayed from the time t2a, the switch S2B in the off state is turned on, and at the time t2c slightly delayed from the time t2b, the switch S2A in the off state is turned on by the controller 4 as illustrated in FIG. 5D. As a result, the inverting input terminal of the differential amplifier 2 has the same potential as the output terminal B, the output voltage Vout is the reference voltage Vcm, and the voltage of the capacitor C1 at the node N1 is also charged to Vcm.

Subsequently, at the time t2d slightly delayed from the time t2c, the switch S1 in the off state is turned on by the controller 4 as illustrated in FIG. 5B. As a result, the sampling capacitor Cs is connected to the input terminal A and charged by the input voltage Vin.

Consequently, the sampling capacitor Cs is charged by the input voltage Vin and the potential increases, and as the switches S2A and S2B are turned on, the output voltage Vout of the output terminal B increases to Vcm and 0.7 V is output as illustrated in FIG. 5F.

According to the second embodiment, since the off-timings of the switches S2A and S2B are shifted at the time of the transition from the period of sampling φ1 to the period of holding φ2, it is possible to reduce a channel charge injection error and ripple noise at the time of switching in addition to the effects of the first embodiment.

Third Embodiment

Figure 6:
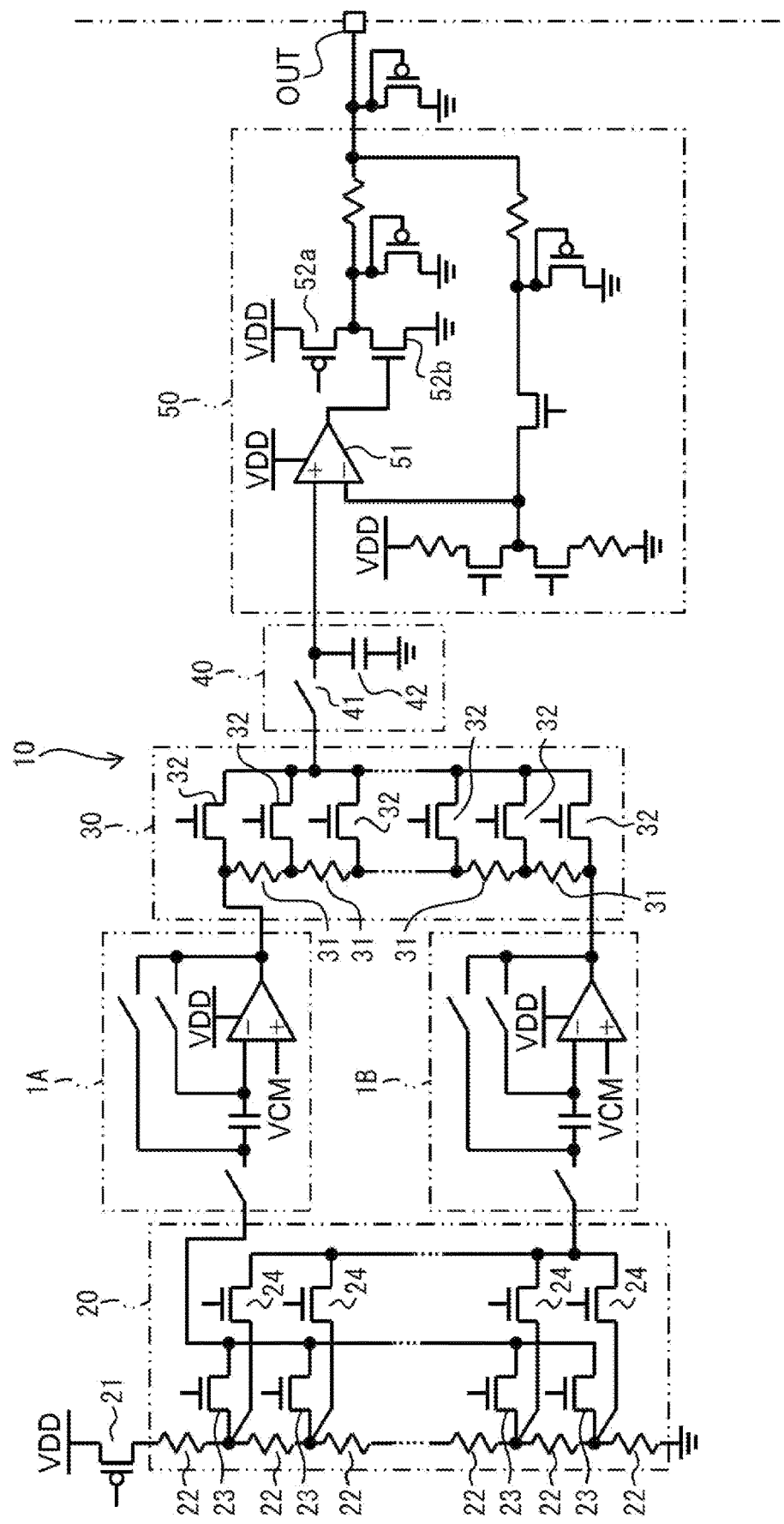
FIG. 6 is an electrical configuration diagram in a case where switched-capacitor amplifiers are incorporated in a digital-to-analog conversion circuit according to a third embodiment.

FIG. 6 illustrates a third embodiment. The present embodiment illustrates a circuit example using the SC amplifier 1 described in the second embodiment. In the circuit illustrated, two SC amplifiers 1A and 1B with the same configuration are applied as intermediate buffer circuits of 2-stage, 6-bit string ladders provided inside a DAC 10 that is a digital-to-analog conversion circuit.

Hereinafter, the configuration and operation of the DAC 10 will be briefly described. The DAC 10 includes a 6-bit pre-stage resistor ladder 20, two SC amplifiers 1A and 1B, a 6-bit post-stage resistor ladder 30, a sample and hold circuit 40, a gain amplifier 50 as an output stage circuit, and the like.

In the pre-stage resistor ladder 20, a circuit in which a plurality of resistors 22 are connected in series is connected to output 6 bits from a DC power supply VDD via a MOS transistor 21. The drains of two MOS transistors 23 and 24 are connected to each of common connection points of the plurality of resistors 22. The sources of the plurality of MOS transistors 23 are commonly connected to be connected to an input terminal of the SC amplifier 1A. Further, the sources of the plurality of MOS transistors 24 are commonly connected to be connected to an input terminal of the SC amplifier 1B.

The DC power supply VDD is divided by the plurality of resistors 22, and a divided voltage is output to each common connection point. The divided voltage of the common connection point at which any one of the plurality of MOS transistors 23 is selectively turned on is selected and output to the SC amplifier 1A on a high-voltage side. In addition, the divided voltage of the common connection point at which any one of the plurality of MOS transistors 24 is selectively turned on is selected and output to the SC amplifier 1B on a low-voltage side.

Each of the SC amplifiers 1A and 1B samples the input voltage Vin of the input terminal into the sampling capacitor Cs during the period of sampling φ1, and outputs the input voltage Vin as the output voltage Vout at the output terminal during the subsequent period of holding φ2.

In the post-stage resistor ladder 30, a circuit in which a plurality of resistors 31 are connected in series is connected between the output terminals of the two SC amplifiers 1A and 1B to output 6 bits. The drain of the MOS transistor 32 is connected to each of common connection points of the plurality of resistors 31. The sources of the plurality of MOS transistors 32 are commonly connected to be connected to an input terminal of the sample and hold circuit 40.

In the post-stage resistor ladder 30, the voltage output across the output terminals of the two SC amplifiers 1A and 1B is divided by the plurality of resistors 31, and a divided voltage is output to each common connection point. In the post-stage resistor ladder 30, when any one of the plurality of MOS transistors 32 is selectively turned on, the divided voltage generated by the resistor 31 at the common connection point is output to the sample and hold circuit 40.

The sample and hold circuit 40 includes a switch 41 and a sampling capacitor 42. The sample and hold circuit 40 turns on the switch 41 to charge the voltage input from the post-stage resistor ladder 30 into the sampling capacitor 42, and outputs the sampled voltage to the gain amplifier 50.

The gain amplifier 50 mainly includes a differential amplifier 51, MOS transistors 52a and 52b, and the like, and amplifies the voltage input from the sample and hold circuit 40 by the differential amplifier 51 or the like and outputs the amplified voltage to an output terminal OUT.

With the above configuration, as the two SC amplifiers 1A and 1B described in the second embodiment are provided between the pre-stage resistor ladder 20 and the post-stage resistor ladder 30, it is possible to restrict a decrease in the output voltage Vout during the period of holding φ2. As a result, more accurate conversion processing can be performed in D/A conversion processing, as compared with the case of using the SC amplifier with the conventional configuration.

Fourth Embodiment

Figure 7:
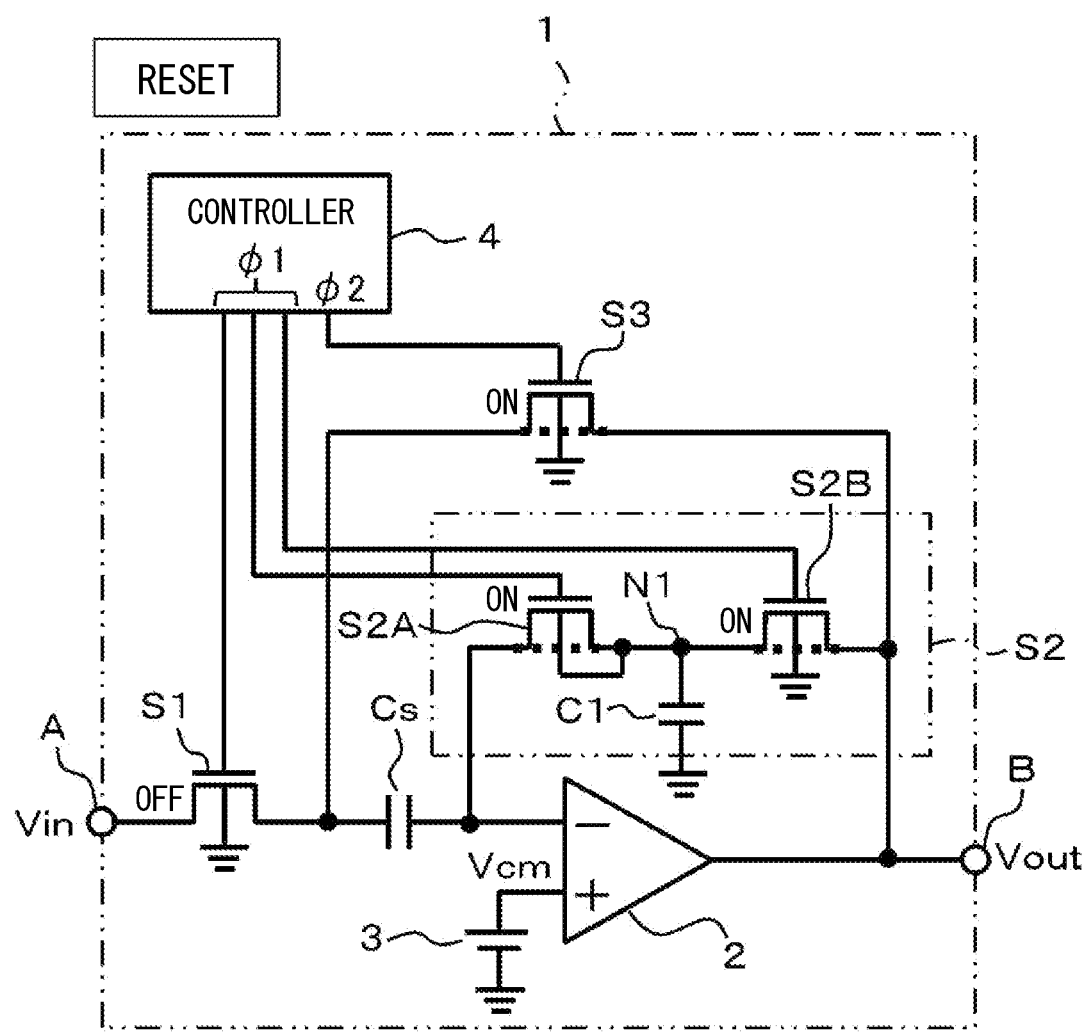
FIG. 7 is an operation explanatory diagram according to a fourth embodiment.

FIG. 7 illustrates a fourth embodiment, and hereinafter, portions different from those of the first embodiment will be described. The present embodiment describes the control content of a reset operation in the SC amplifier 1. The reset operation is a process for preventing a malfunction from occurring due to the remaining charge of the capacitor C1 in a case where the power supply is momentarily interrupted or at the time of start-up.

At the time of start-up or in a case where the power supply is momentarily interrupted, the controller 4 performs the reset operation as follows before performing the operation in the period of sampling φ1 or the period of holding φ2b. As illustrated in FIG. 7, the switch S1 is held in the off state, and the switches S2A, S2B, and S3 are turned on.

As a result, the sampling capacitor Cs is short-circuited between both terminals, so that the charge is discharged and no potential difference is present. In addition, since the potential of the node N1 is equal to the potential of the voltage Vcm of the non-inverting input terminal, the voltage of the capacitor C1 is also Vcm. As a result, the sampling operation of the controller 4 in the subsequent period of sampling φ1 can be accurately performed.

Fifth Embodiment

Figure 8:
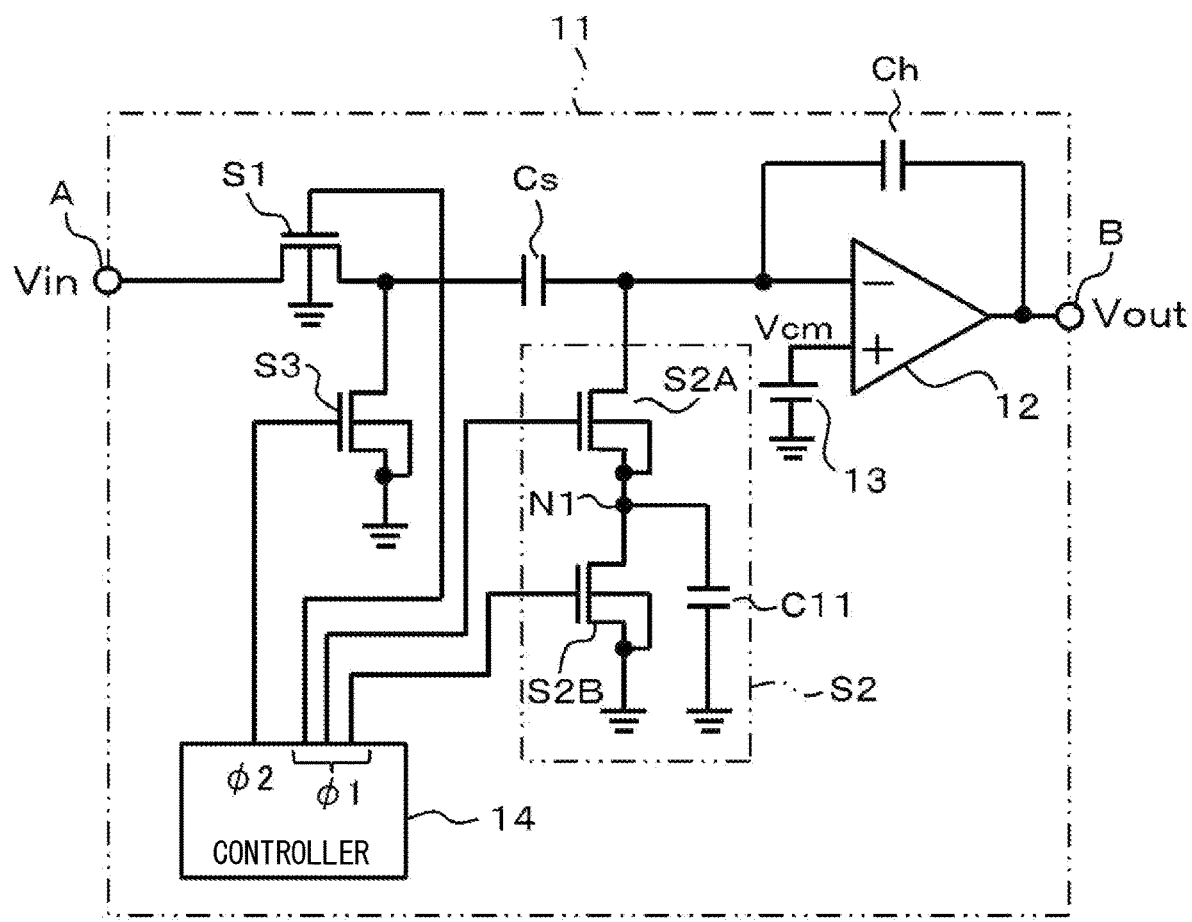
FIG. 8 is an electrical configuration diagram illustrating a switched-capacitor amplifier according to a fifth embodiment.
Figure 9:
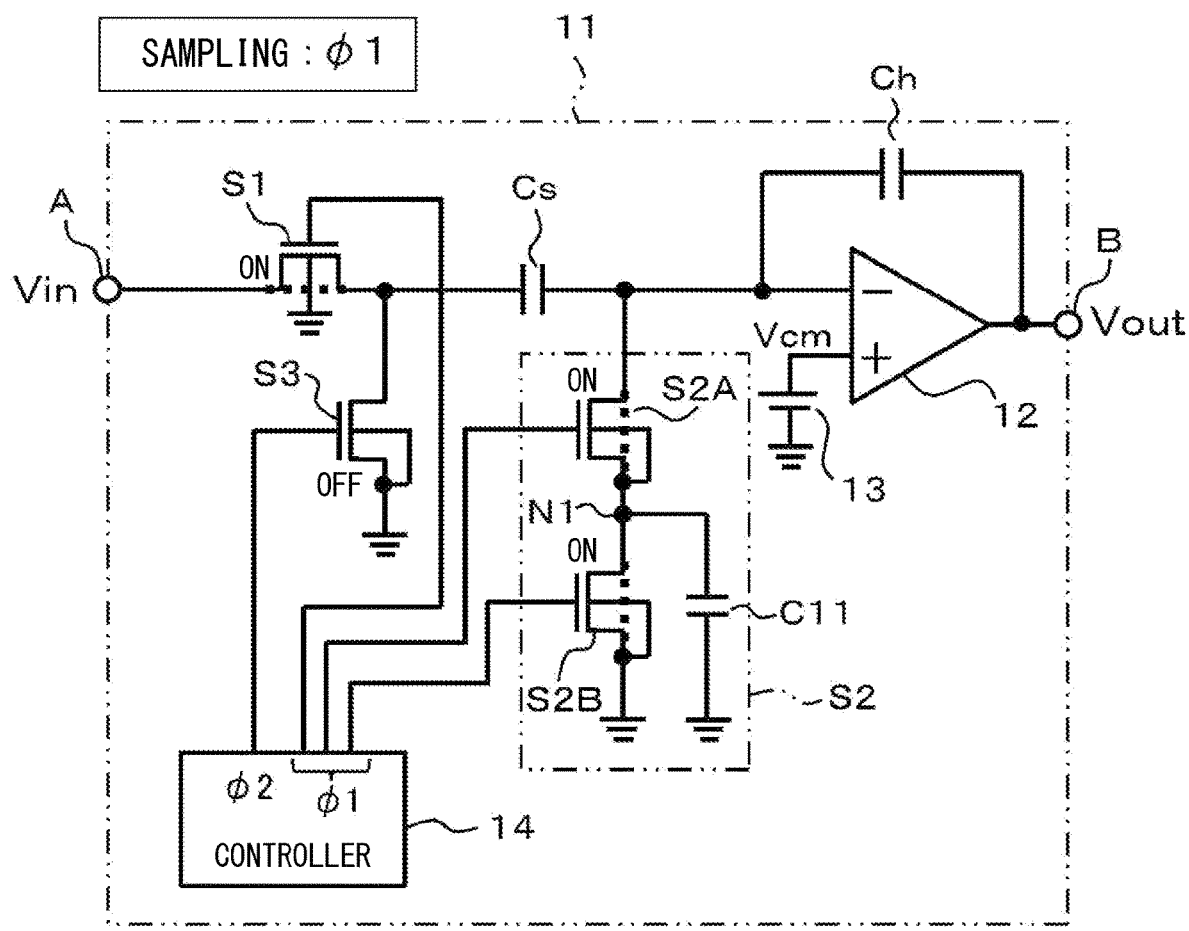
FIG. 9 is a first operation explanatory diagram according to the fifth embodiment.
Figure 10:
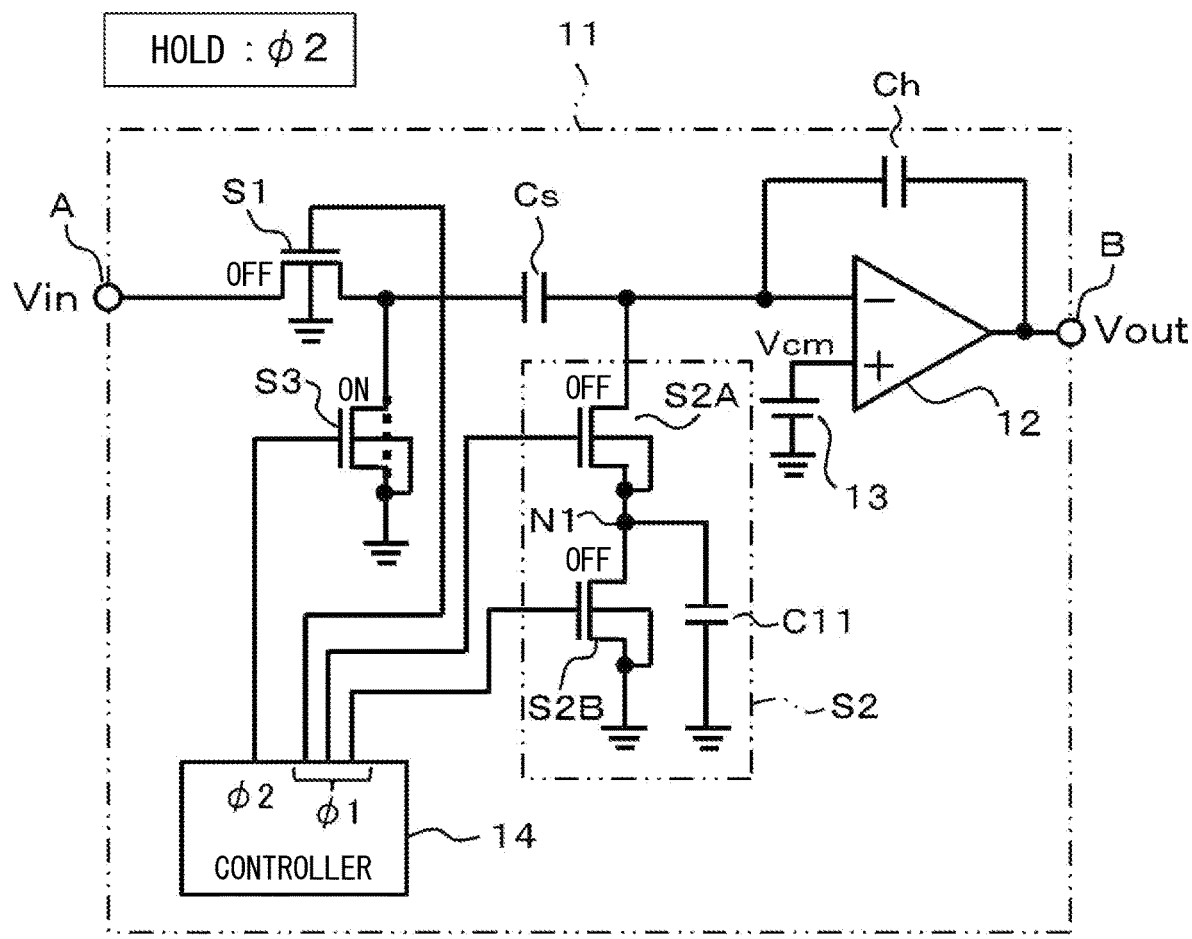
FIG. 10 is a second operation explanatory diagram according to the fifth embodiment.

FIGS. 8 to 10 illustrate a fifth embodiment, and hereinafter, portions different from those of the first embodiment will be described. The present embodiment describes a configuration in a case where the application target is an integrated SC amplifier 11.

As illustrated in FIG. 8, the SC amplifier 11 of the present embodiment also includes a differential amplifier 12, a reference power supply 13, a controller 14, the sampling capacitor Cs, and the switches S1 to S3. The switches S1 and S3 are n-channel MOS transistors. The switch S2 includes the switches S2A and S2B including n-channel MOS transistors and a capacitor C11.

The input terminal A of the SC amplifier 11 is connected to one terminal of the sampling capacitor Cs via the switch S1. The substrate potential, that is, the back gate of the switch S1 is connected to the ground. The other terminal of the sampling capacitor Cs is connected to an inverting input terminal of the differential amplifier 12. The output terminal of the differential amplifier 12 is connected to the output terminal B and is also connected to the inverting input terminal via a capacitor Ch as an integral capacitor. The non-inverting input terminal of the differential amplifier 12 is connected so as to receive the reference voltage Vcm from a reference power supply 13.

The series circuit of the switches S2A and S2B is connected between the inverting input terminal of the differential amplifier 12 and the ground. The capacitor C11 is connected between the node N1 of the switches S2A and S2B and the ground. In addition, the back gate of the switch S2A is connected to the node N1 together with the source. The back gate of the switch S2B is connected to the ground. In the switch S3, the drain is connected to a common connection point of the switch S1 and the sampling capacitor Cs, and the source is connected to the ground.

The controller 14 applies a drive signal to the gates of the switches S1, S2A, S2B, and S3 to execute on and off control. The controller 14 executes drive control of the switches S1, S2A, S2B, and S3 in the respective periods of sampling φ1 and holding φ2 according to sampling and hold signals provided from the outside.

Next, the operation of the above configuration will be briefly described. The drive control of the switches S1, S2A, S2B, and S3 by the controller 14 can be executed in the same manner as in the first embodiment or the second embodiment.

That is, as illustrated in FIG. 9, in the period of sampling φ1, the input voltage Vin applied to the input terminal A is first taken into the sampling capacitor Cs. During the period of sampling φ1, the controller 14 executes drive control to turn on the switches S1, S2A, and S2B and turn off the switch S3. In FIG. 9, the source and the drain of each of the switches S1, S2A, and S2B are connected by a thick dotted line to indicate the on state.

As a result, the input voltage Vin is applied to the sampling capacitor Cs. At this time, the circuit path between the output terminal and the inverting input terminal of the differential amplifier 12 is conductive and has the same potential as the output terminal B. In addition, since the reference voltage Vcm is applied to the non-inverting input terminal of the differential amplifier 12, the inverting input terminal also has the reference voltage Vcm.

As a result, the input voltage Vin and the reference voltage Vcm are applied between both terminals of the sampling capacitor Cs, and the charge corresponding to a difference voltage Vin-Vcm is accumulated in the sampling capacitor Cs. In addition, at this time, the charge corresponding to the reference voltage Vcm is accumulated in the capacitor C11 connected to the node N1 of the switches S2A and S2B.

Next, as illustrated in FIG. 10, in the period of holding φ2, a voltage based on the charge taken in the sampling capacitor Cs is output to the capacitor Ch. During the period of holding φ2, the controller 14 executes drive control to turn off the switches S1, S2A, and S2B and turn on the switch S3. In FIG. 10, the source and the drain of the switch S3 are connected by a thick dotted line to indicate the on state.

As a result, the charge accumulated in the sampling capacitor Cs is transferred to the capacitor Ch. At this time, the inverting input terminal of the differential amplifier 12 has the same potential as the voltage Vcm of the non-inverting input terminal. In addition, the inverting input terminal of the differential amplifier 12 is connected to the drain of the switch S2A in the off state.

Here, in the switch S2A in the off state, the potential of the drain is Vcm, and the potential of the source is also held at Vcm by the charge charged in the capacitor C11. Further, since the back gate of the switch S2A is connected to the source, the potential is held at Vcm. As a result, in the switch S2A, the drain, the source, and the back gate all have the same potential Vcm, and the off state where no leakage occurs is maintained.

Consequently, effects similar to those of the first embodiment can be obtained by the fifth embodiment.

In addition, in a case where the controller 14 executes on and off drive control of the switches S1, S2A, S2B, and S3 in the same manner as in the second embodiment, effects similar to those of the second embodiment can be obtained.

Sixth Embodiment

Figure 11:
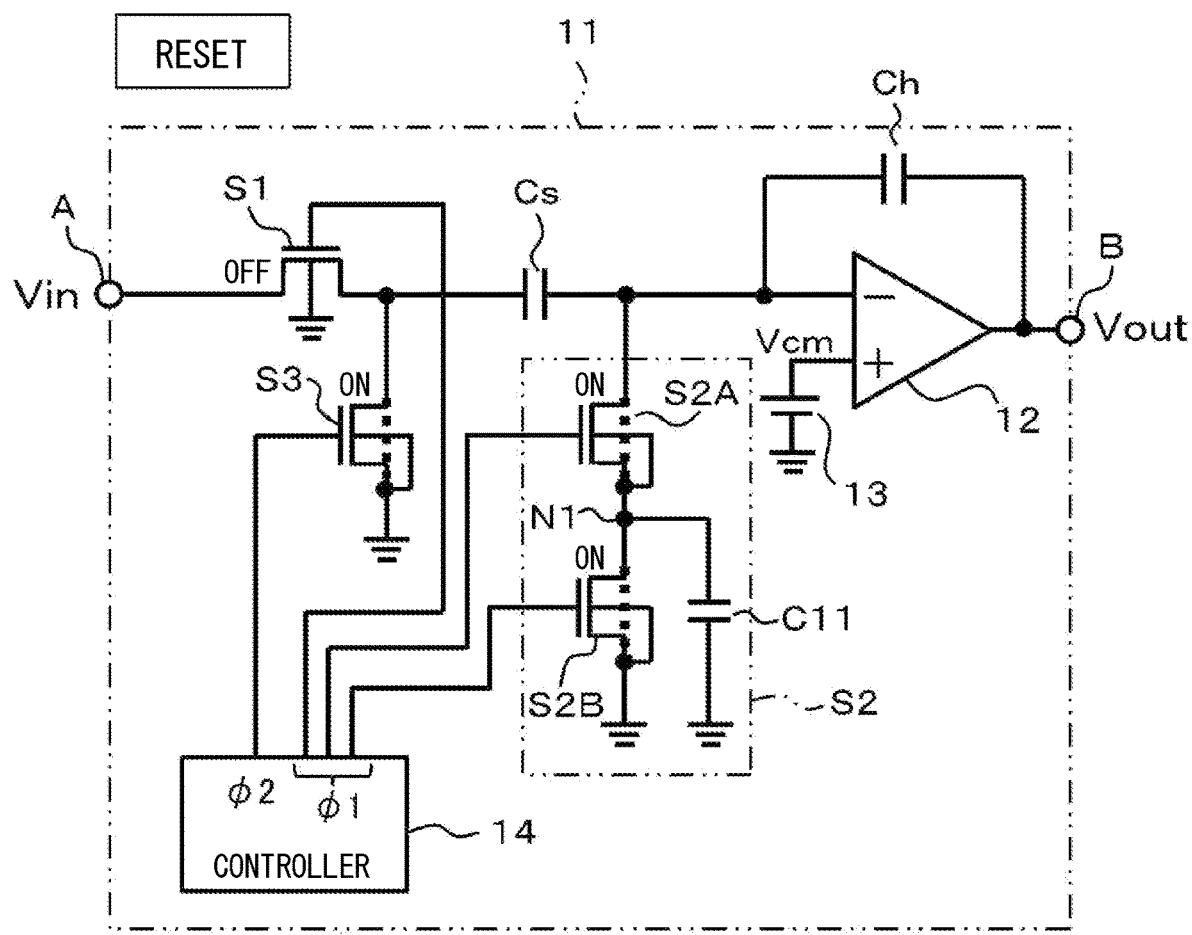
FIG. 11 is an operation explanatory diagram according to a sixth embodiment.

FIG. 11 illustrates a sixth embodiment, and hereinafter, portions different from those of the fifth embodiment will be described. The present embodiment describes the control content of a reset operation in the SC amplifier 11. The reset operation is a process for preventing a malfunction from occurring due to the remaining charge of the capacitor C11 in a case where the power supply is momentarily interrupted or at the time of start-up.

At the time of start-up or in a case where the power supply is momentarily interrupted, the controller 14 performs the reset operation as follows before performing a sampling or holding operation. As illustrated in FIG. 11, the switch S1 is held in the off state, and the switches S2A, S2B, and S3 are turned on.

As a result, the sampling capacitor Cs is short-circuited between both terminals, so that the charge is discharged and no potential difference is present. In addition, since the potential of the node N1 is equal to the potential of the voltage Vcm of the non-inverting input terminal, the voltage of the capacitor C11 is also Vcm.

As a result, the sampling operation of the controller 14 in the subsequent period of sampling φ1 can be accurately performed.

Seventh Embodiment

Figure 12:
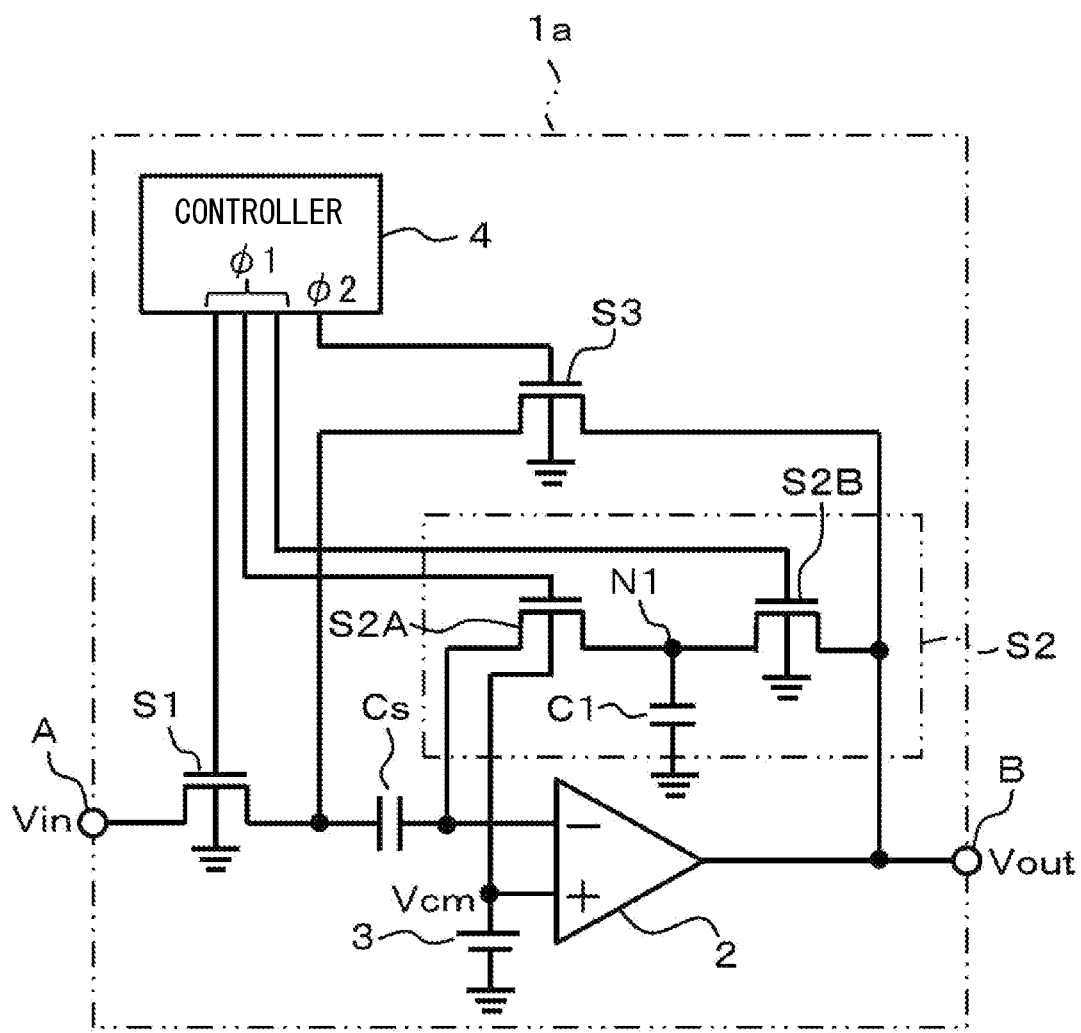
FIG. 12 is an electrical configuration diagram illustrating a switched-capacitor amplifier according to a seventh embodiment.

FIG. 12 illustrates a seventh embodiment, and hereinafter, portions different from those of the first embodiment will be described. The back gate of the switch S2A in the SC amplifier 1 is connected to the node N1 in the first embodiment, whereas the back gate of the switch S2A in a SC amplifier 1a is connected to the terminal of the reference potential Vcm of the reference power supply 3 in the present embodiment, as illustrated in FIG. 12.

That is, in the present embodiment, wires are provided so that the reference potential Vcm of the reference power supply 3 is applied to the back gate of the switch S2A by taking advantage of the fact that the SC amplifier 1a is formed on an SOI substrate. As a result, since the back gate of the switch S2A is always held at the reference potential Vcm, operational effects similar to those of the first embodiment can be obtained.

Eighth Embodiment

Figure 13:
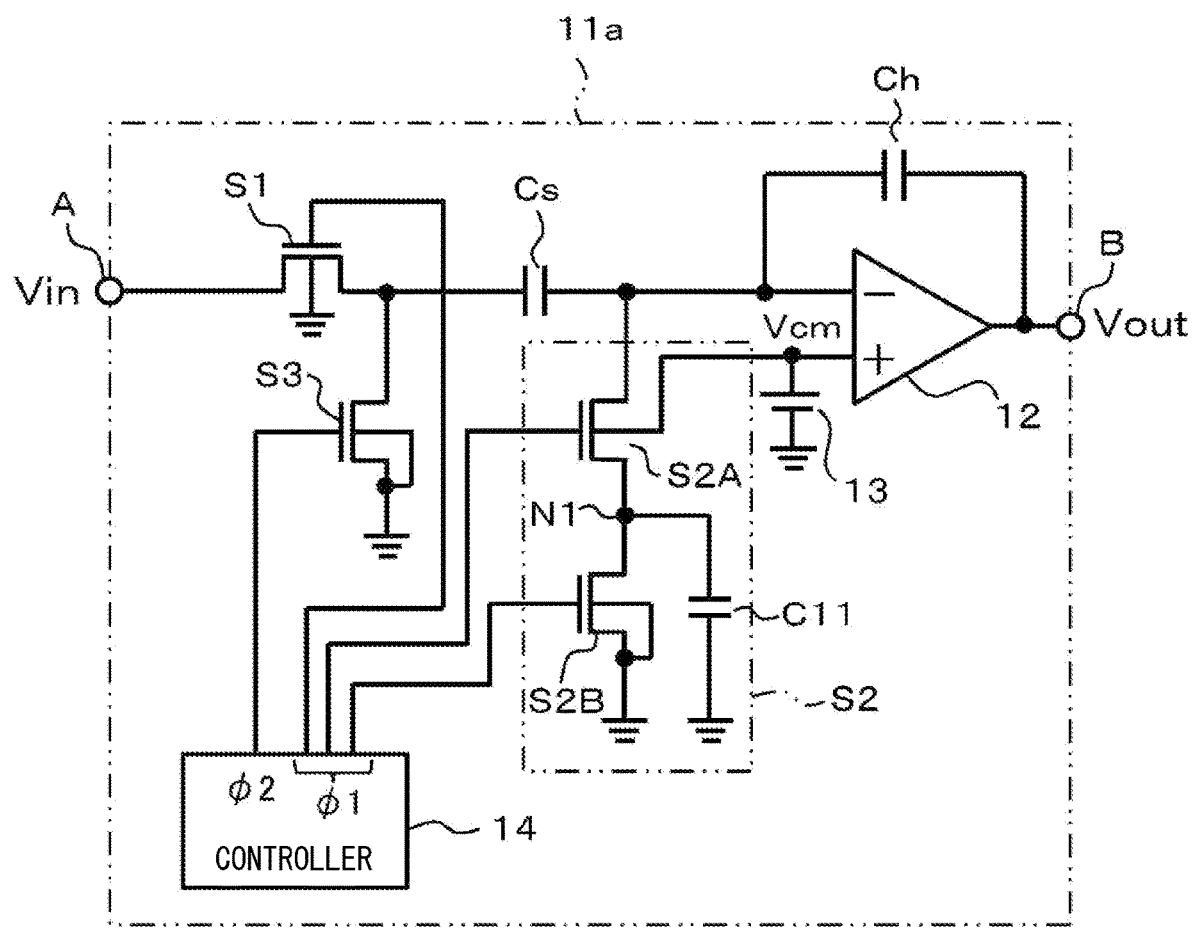
FIG. 13 is an electrical configuration diagram illustrating a switched-capacitor amplifier according to an eighth embodiment.

FIG. 13 illustrates an eighth embodiment, and hereinafter, portions different from those of the fifth embodiment will be described. The back gate of the switch S2A in the SC amplifier 11 is connected to the node N1 in the fifth embodiment, whereas the back gate of the switch S2A in a SC amplifier 11a is connected to the terminal of the reference potential Vcm of the reference power supply 13 in the present embodiment, as illustrated in FIG. 13.

That is, in the present embodiment, wires are provided so that the reference potential Vcm of the reference power supply 13 is applied to the back gate of the switch S2A by taking advantage of the fact that the SC amplifier 11a is formed on an SOI substrate. As a result, since the back gate of the switch S2A is always held at the reference potential Vcm, operational effects similar to those of the fifth embodiment can be obtained.

Ninth Embodiment

Figure 14:
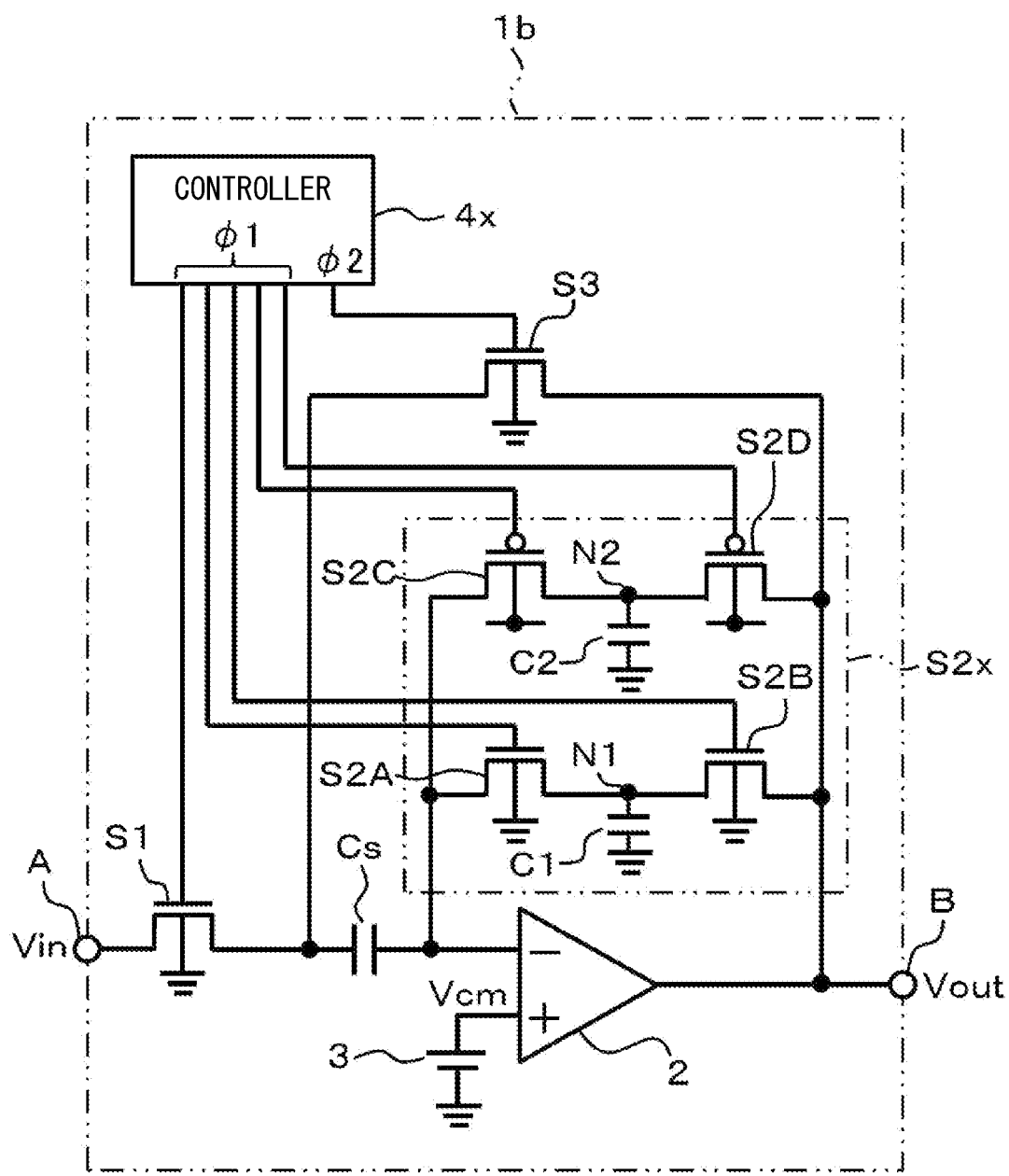
FIG. 14 is an electrical configuration diagram illustrating a switched-capacitor amplifier according to a ninth embodiment.

FIG. 14 illustrates a ninth embodiment, and hereinafter, portions different from those of the first embodiment will be described. In the present embodiment, a switch S2x is provided instead of the switch S2 in a SC amplifier 1b.

In FIG. 14, the switch S2x of the SC amplifier 1b has a configuration in which four MOS transistors are used as the switches S2A to S2D, and two capacitors C1 and C2 are provided. A controller 4x controls on and off drive of the switches S1, S2x, and S3. Note that the switches S2A and S2B are n-channel MOS transistors, and the switches S2C and S2D are p-channel MOS transistors.

As in the first embodiment, the switches S2A and S2B, which are in series connection with each other, are connected between the inverting input terminal and the output terminal of the differential amplifier 2. The capacitor C1 is connected between the node N1, which is a common connection point of the switches S2A and S2B, and the ground. Unlike the first embodiment, the back gate of the switch S2A is connected to the ground together with the back gate of the switch S2B.

The switches S2C and S2D, which are in series connection with each other, are connected between the inverting input terminal and the output terminal of the differential amplifier 2. The capacitor C2 is connected between a node N2, which is a common connection point of the switches S2C and S2D, and the ground. The back gates of the switches S2C and S2D are both connected to a power supply terminal.

In the above configuration, when the switch S2x is turned off during the period of holding φ2 by the controller 4x, that is, when the switches S2A to S2D are turned off, junction leakage from the drain to the back gate occurs in the switch S2A because the switch S2A has the conventional configuration. As a result, the charge flows from the drain side of the switch S2A to the back gate side, resulting in a decrease in the voltage.

On the other hand, since the switch S2C is in the off state but the back gate is connected to the power supply terminal, junction leakage occurs in the same manner, so that the charge flows from the back gate side to the drain side. As a result, the charge flowing out of the drain of the switch S2C flows into the drain side of the switch S2A, and it is possible to significantly reduce the error due to the lapse of time in the period of holding φ2 caused by the junction leakage.

Furthermore, if the amount of charges flowing from the switch S2C to the drain side and the amount of charges taken into the switch S2A can be set to be balanced, effects substantially similar to those of the first embodiment can be obtained.

Tenth Embodiment

Figure 15:
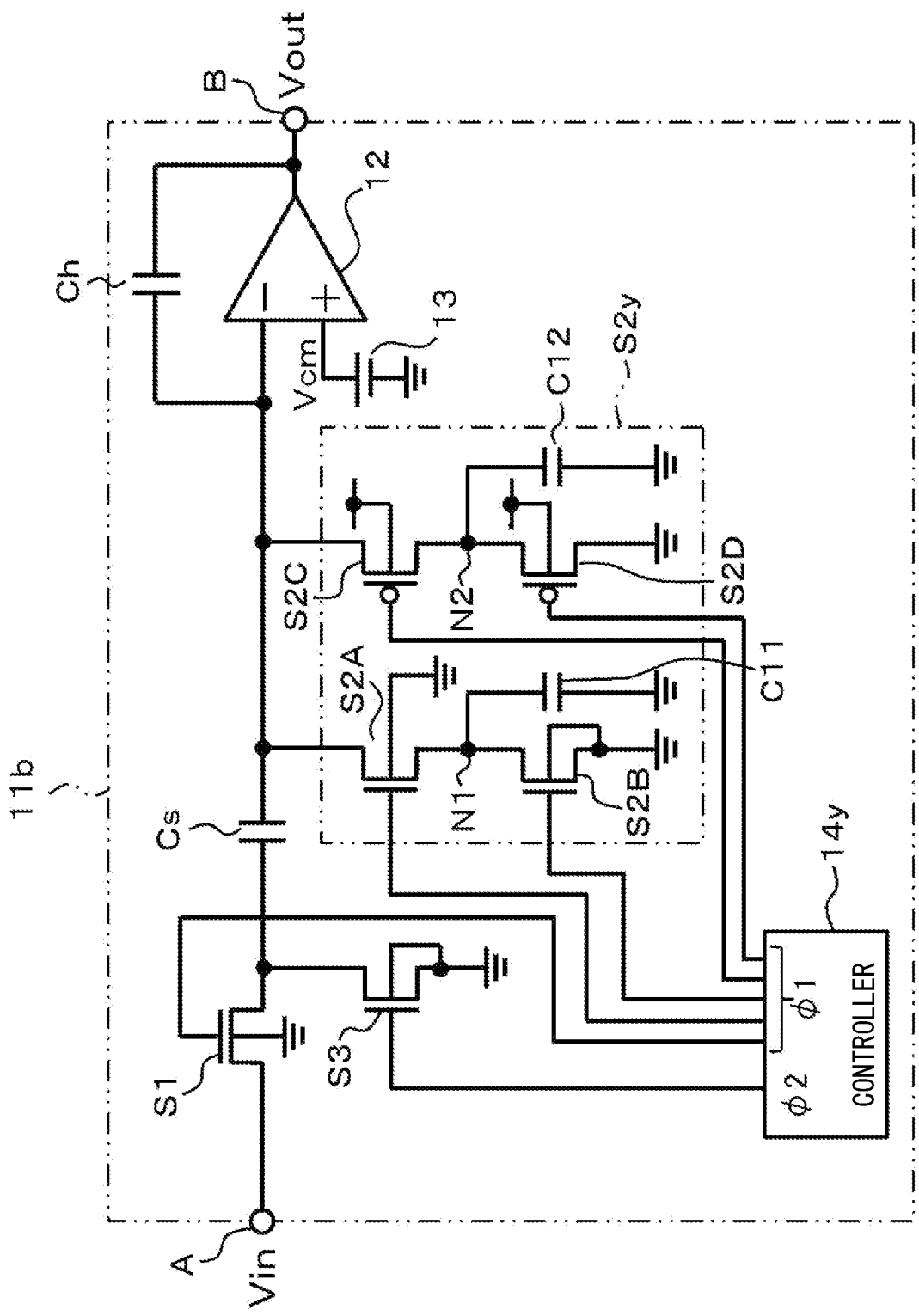
FIG. 15 is an electrical configuration diagram illustrating a switched-capacitor amplifier according to a tenth embodiment.

FIG. 15 illustrates a tenth embodiment, and hereinafter, portions different from those of the fifth embodiment will be described. In the present embodiment, a switch S2y is provided instead of the switch S2 in a SC amplifier 11b.

In FIG. 15, the switch S2y of the SC amplifier 11b has a configuration in which four MOS transistors are used as the switches S2A to S2D, and two capacitors C11 and C12 are provided. A controller 14y controls on and off drive of the switches S1, S2x, and S3. Note that the switches S2A and S2B are n-channel MOS transistors, and the switches S2C and S2D as the third and fourth MOS transistors are p-channel MOS transistors.

As in the fifth embodiment, the switches S2A and S2B, which are in series connection with each other, are connected between the inverting input terminal of the differential amplifier 12 and the ground. The capacitor C11 is connected between the node N1, which is a common connection point of the switches S2A and S2B, and the ground. Unlike the fifth embodiment, the back gate of the switch S2A is connected to the ground together with the back gate of the switch S2B.

The switches S2C and S2D, which are in series connection with each other, are connected between the inverting input terminal of the differential amplifier 12 and the ground. The capacitor C12 is connected between the node N2, which is a common connection point of the switches S2C and S2D, and the ground. The back gates of the switches S2C and S2D are both connected to a power supply terminal.

In the above configuration, when the switch S2y is turned off, that is, when the switches S2A to S2D are turned off during the period of holding φ2 by the controller 14y, junction leakage from the drain to the back gate occurs in the switch S2A because the switch S2A has the conventional configuration. As a result, the charge flows from the drain side of the switch S2A to the back gate side, resulting in a decrease in the voltage.

On the other hand, since the switch S2C is in the off state but the back gate is connected to the power supply terminal, junction leakage occurs in the same manner, so that the charge flows from the back gate side to the drain side. As a result, the charge flowing out of the drain of the switch S2C flows into the drain side of the switch S2A, and it is possible to significantly reduce the error due to the lapse of time in the period of holding φ2 caused by the junction leakage.

Furthermore, if the amount of charges flowing from the switch S2C to the drain side and the amount of charges taken into the switch S2A can be set to be balanced, effects substantially similar to those of the fifth embodiment can be obtained.

Other Embodiments

Note that the present disclosure is not limited to the embodiments described above, and can be applied to various embodiments without departing from the gist of the present disclosure. For example, the present disclosure can be modified or expanded as follows.

In the above embodiments, the SC amplifier 1, 1A, 1B, 1a, 1b, 11, 11a, or 11b applied to a single-ended amplifier has been described in the second and subsequent embodiments, but the present disclosure is not limited thereto, and the present disclosure can also be applied to a differential SC amplifier.

Although the present disclosure has been described in accordance with the above embodiments, it is understood that the present disclosure is not limited to the above embodiments and structures. The present disclosure encompasses various modifications and variations within the scope of equivalents. In addition, while the various elements are shown in various combinations and configurations, which are exemplary, other combinations and configurations, including more, less or only a single element, are also within the spirit and scope of the present disclosure.

What is claimed is:

1. A switched-capacitor amplifier comprising:
a sampling capacitor;
a first switch connected between a signal input terminal and one terminal of the sampling capacitor;
a differential amplifier including an inverting input terminal connected to another terminal of the sampling capacitor and an output terminal connected to a signal output terminal;
a reference power supply configured to apply a predetermined voltage to a non-inverting input terminal of the differential amplifier;
a second switch connected between the inverting input terminal of the differential amplifier and the signal output terminal;
a third switch connected between a common connection point of the first switch and the sampling capacitor and the signal output terminal; and
a controller configured to execute on and off control of the first to third switches, wherein
the second switch includes a series circuit of first and second metal oxide semiconductor (MOS) transistors and a potential holding capacitor connected between a node that is a common connection point of the first and second MOS transistors and a ground, and a back gate of the first MOS transistor is connected only to the node together with a source of the first MOS transistor.

2. The switched-capacitor amplifier according to claim 1, wherein
the controller is further configured to turn off the first MOS transistor, turn off the second MOS transistor, turn off the first switch, and turn on the third switch in a stated order at a time of switching from a sampling state to a hold state, and
the controller is further configured to turn off the third switch, turn on the second MOS transistor, turn on the first MOS transistor, and turn on the first switch in a stated order at a time of switching from the hold state to the sampling state.

3. The switched-capacitor amplifier according to claim 1, wherein
the controller is further configured to turn on all of the first and second MOS transistors and the third switch at a time of a reset operation.

4. The switched-capacitor amplifier according to claim 1, wherein a back gate of the second MOS transistor is directly connected to the ground.

* * * * *